(12) United States Patent
Huang et al.

(10) Patent No.: US 6,887,972 B2
(45) Date of Patent: May 3, 2005

(54) BLUE ELECTROLUMINESCENT MATERIALS FOR POLYMER LIGHT-EMITTING DIODES

(75) Inventors: Wei Huang, Singapore (SG); Wang Lin Yu, Singapore (SG); Jian Pei, Singapore (SG); Soo Jin Chua, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 0 days.

(21) Appl. No.: 09/841,705

(22) Filed: Apr. 24, 2001

(65) Prior Publication Data

US 2002/0013451 A1 Jan. 31, 2002

(30) Foreign Application Priority Data

Apr. 24, 2000  (SG) ..................................... 200002255-8

(51) Int. Cl.[7] .............................................. C08G 73/00
(52) U.S. Cl. ....................... 528/422; 528/425; 525/191; 525/202; 525/242; 428/690; 428/691; 428/917; 313/504
(58) Field of Search ................................ 528/422, 425, 528/373, 384, 39, 397; 525/191, 202, 242; 428/690, 691, 917; 313/504; 429/212, 213

(56) References Cited

U.S. PATENT DOCUMENTS

| | | | |
|---|---|---|---|
| 5,189,136 A | 2/1993 | Wudl et al. | 528/86 |
| 5,399,502 A | 3/1995 | Friend et al. | 437/1 |
| 5,708,130 A | 1/1998 | Woo et al. | 528/397 |
| 5,777,070 A | 7/1998 | Inbasekaran et al. | 528/394 |
| 5,807,974 A | 9/1998 | Kim et al. | 528/366 |
| 5,876,864 A | 3/1999 | Kim et al. | 428/690 |
| 5,900,327 A | 5/1999 | Pei et al. | 428/690 |

FOREIGN PATENT DOCUMENTS

| | | |
|---|---|---|
| JP | 11-199656 | 7/1999 |
| JP | 11-349668 | 12/1999 |
| WO | 97/05184 | 2/1997 |
| WO | 97/33323 | 9/1997 |
| WO | 98/33836 | 8/1998 |

OTHER PUBLICATIONS

Yu et al.; "Molecular engineering—of blue electroluminescent polymer", 2000, Chem Abstract 133; 267744.*
Burroughes et al.; "Organic light emitters using active material blends", 2000, Chem Abstract 133: 185304.*
Anne et al.; "Light emitting diodes from fluorene base conjugated polymers", 2000, Chem Abstract 133: 164431.*
Yu et al.; "Molecular design of light emitting polymers", 2000, Chem Abstract 133: 59158.*
Yu et al.; "Blue polymer light emitting diodes—p–phenylene", 1999, Chem Abstract 132: 85386.*

(Continued)

Primary Examiner—Duc Truong
(74) Attorney, Agent, or Firm—Ladas & Parry

(57) ABSTRACT

A polymeric material comprising alternate substituted fluorene and phenylene units, as represented by the following formula

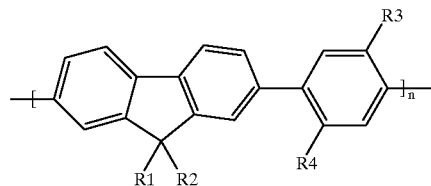

wherein $R_1$, $R_2$, $R_3$ and $R_4$, which may be identical or different, are each selected from the group consisting of H, a ($C_1$–$C_{22}$) linear or branched alkyl, alkoxy or oligo (oxyetylene) group, a ($C_6$–$C_{30}$) cycloalkyl group, and an unsubstituted or substituted aryl group, and n is from about 3 to about 5000.

18 Claims, 5 Drawing Sheets

OTHER PUBLICATIONS

Figure 1:
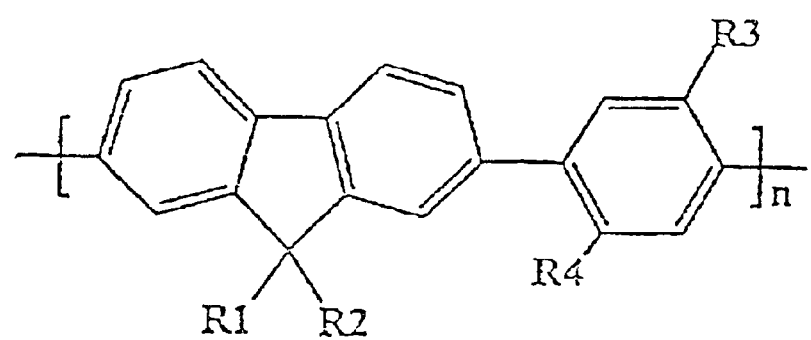

Yu et al.;"New efficient blue light emitting polymer for light emitting diodes", 1999, Chem Abstract 131: 352186.*

Ranger et al.; "Optical and electrical properties of fluorene based conjugated polymers", 1998, Chem Abstract 130: 282433.*

Cho et al.; "Control of band gaps of conjugated polymers by copolymerization", 1997, Chem Abstract 128: 210277.*

Grice, Alan W., et al., "A Blue–Emitting Triazole–Based Conjugated Polymer," *Advanced Materials*, vol. 9, No. 15, pp. 11–74–1178 (1997).

Andersson, M.R. et al., "Electroluminescence from Substituted Poly(thiophenes) : From Blue to Near–Infrared," *Macromolecules*, vol. 28, pp. 7525–7529 (1995).

Kang, Bong Soo, et al., "Wavelength tuning of light–emitting polyarenes via and m–phenylene interrupting block: π–π* band–gap adjustment of thiophene–based conjugated polymers," *Chem. Commun.*, pp. 1167–1168 (1996).

Yu, Wang–Lin, et al., "Synthesis of 1,4–bis (1,3, 4–oxadiazol–2–yl)–2,5–dialkoxybenzene–oligothiophene copolymers with different emissive colors: synthetically tuning the photoluminescence of conjugated polymers," *Chem. Commun., pp.* 1957–1958 (1998).

Garten, Frank, et al., "Efficient Blue LEDs from a Partially Conjugated Si–Containing PPV Copolymer in a Double-Layer Configuration," *Advanced Materials*, vol. 9, No. 2, pp. 127–131 (1997).

Hosokawa, Chishio, et al., "Bright blue electroluminescence from hole transporting polycarbonate," *Appl. Phys. Lett.*, vol. 61, No. 21, pp. 2503–2505 (Nov. 23, 1992).

Cimrová, Vera, et al., "Blue Light–Emitting Devices Based on Novel Polymer Blends," *Advanced Materials*, vol. 10, No. 9, pp. 676–680 (1998).

Grem, Gabriele, et al., "Realization of a Blue–Light–Emitting Device using Poly(*p*–phenylene)," *Advanced Materials*, vol. 4, No. 1, pp. 36–37 (1992).

Yang, Y., et al., "Efficient blue polymer light–emitting diodes from a series of soluble poly(paraphenylene)s," *J. Appl. Phys.*, vol. 79, No. 2, pp. 934–939 (Jan. 15, 1996).

Vahlenkamp, Thomas, et al., "Poly (2,5–dialkoxy–*p*–phenylene)s—synthesis and properties," *Macromol. Chem. Phys.*, vol. 195, pp. 1933–1952 (1994).

Fukuda, Masahiko, et al., "Synthesis of Fusible and Soluble Conducting Polyfluorene Derivatives and Their Characteristics," *Journal of Polymer Science: Part A: Polymer Chemistry*, vol. 31, pp. 2465–2471 (1993).

Ohmori, Yutaka, et al., "Blue Electroluminescent Diodes Utilizing Poly (alkyfluorene)," *Japanese Journal of Applied Physics*, vol. 30, No. 11B, pp. L 1941–1943 (Nov. 1991).

Pei, Qibing, et al., "Efficient Photoluminescence and Electroluminescene from a Soluble Polyfluorene," *J. Am. Chem. Soc.*, vol. 118, pp. 7416–7417 (1996).

Grice, A.W., "High brightness and efficiency blue lightemitting polymer diodes," *Applied Physics Letters*, vol. 73, No. 5, pp. 629–631 (Aug. 3, 1998).

Janietz, S., et al., "Electrochemical determination of the ionization potential and electron affinity of poly (9,9–dioctylfluorene)," *Applied Physics Letters*, vol. 73, No. 17, pp. 2453–2455 (Oct. 26, 1998).

Friend, R.H., et al. "Electroluminescence in conjugated polymers," *Nature*, vol. 397, pp. 121–128 (Jan. 14, 1999).

Lee, Jeong–Ik, et al., "Oxidative Stability and Its Effect on the Photoluminescence of Poly (Fluorene) Derivatives: End Group Effects," *Chem. Mater.*, vol. 11, pp. 1083–1088 (1999).

\* cited by examiner

BLUE ELECTROLUMINESCENT MATERIALS FOR POLYMER LIGHT-EMITTING DIODES

FIELD OF THE INVENTION

This invention relates to the field of conjugated polymers. More particularly, this invention relates to electroluminescent conjugated polymers, which have a backbone of alternated fluorene and phenylene units, which are soluble in common organic solvents for fabrication of shaped articles such as uniform and pinhole-free films on substrates and which emit blue light in film states, and which may be used as emissive materials in the fabrication of blue light emitting diodes (LEDs).

DISCUSSION OF BACKGROUND

Since the discovery of electrical conductivity of conjugated polymers upon doping, conjugated polymers have grown to be one of the most active research fields in materials science in the past two decades. Conjugated polymers are a novel class of semiconducting materials that combine the optical and electronic properties of semiconductors in general with the processing advantages and mechanical properties of polymers. As the active media, conjugated polymers have been used in the fabrication of many photonic devices, including diodes, light-emitting diodes, photodiodes, polymer grid triodes, field-effect transistors, light-emitting electrochemical cells, and lasers. Significant progress has been made in the development of polymer light emitting-diodes as an emerging display technology. Emission over the whole visible spectrum has been demonstrated with impressive efficiency and brightness. By using a metallic polymer as a hole-injecting contact, robust and mechanically flexible LEDs have been demonstrated. For fall-color displays, efficient red, green, and blue electroluminescnet polymers are required.

However, although all the three colors have been demonstrated in polymer LEDs, only red (orange) such as from poly(2-methoxy-5-(2'-ethyl-hexyloxy)-para-phenylenevinylene) (MEH-PPV) (see U.S. Pat. No. 5,189,136) and green such as from poly(1,4-phenylene vinylene) (PPV) (see U.S. Pat. No. 5,399,502) have sufficient efficiency and stability to be of commercial value.

The first blue polymer LED was fabricated from poly (para-phenylene) (PPP). Subsequently, soluble PPP derivatives were synthesized and used to produce blue polymer LEDs. The PPP derivatives exhibit high photoluminescence (PL) and electroluminescence (EL) efficiencies, but low molecular weights and poor stability of the polymers limit their application in polymer LEDs. Other blue EL polymers include derivatives of PPV, 3,4-disubstituted poly (thiophenes), and some copolymers with conjugated or non-conjugated segments. Although some polymer blends have also been studied for blue electroluminescence, almost none of the polymers has demonstrated good EL performance. In the past few years, 9,9-disubstituted polyfluorenes have attracted considerable attention as blue EL materials. The synthesis of soluble polyflurenes was first disclosed by Fukuka et al. [J. Polym. Sci., Polym. Chem. Ed., Vol. 31, p. 2456 (1993)]. The polymers were obtained by oxidative polymerization, which is not regiospecific and normally results in low degrees of polymerization. Thereafter, the synthesis of well-defined poly(2,7-fluorene) derivatives from 2,7-dihalofluorenes by a nickel (0)-catalyzed coupling reaction was disclosed independently by Woo et al. (WO 97/05184) and Pei et al. (WO 97/33323). More recently, high molecular weight poly(9,9-dioctyl-2,7-fluorene) was synthesized by Inbasekaran et al. through a modified Suzuki coupling reaction (U.S. Pat. No. , 5,777,070). However, sufficient stability of the polymer shown in U.S. Pat. No. 5,777,070 has not been demonstrated. Moreover, the emissive spectra of these polymers normally correspond to a whitish blue instead of pure blue, and this becomes more serious with the operation of EL devices. Thus, there is a need for a more efficient and stable pure blue EL polymer for use, for example, in the fabrication of blue polymer LEDs to realize full-color displays, and it is an object of the present invention to provide this.

Although a degree of blue light emission has been demonstrated by some conjugated polymers, their application in polymer LEDs, considering the efficiency, stability, and processability required, has been mainly focused on substituted poly(para-phenylenes) (PPPs) and 9,9-disubstituted polyfluorenes (PFs). The most attractive properties of PPPs are their high PL and EL efficiencies, but it is difficult to get high molecular weight in PPPs and the stability of PPPs is poor. These serious drawbacks have limited the applications of PPPs in polymer LEDs and other optoelectronic devices. Over the past few years, the efforts of developing efficient and stable blue EL polymers for polymer LEDs have been focused on PFs. High molecular weight and high purity PFs have been successfully synthesized by the Dow Chemical Company and high EL efficiency, high luminance, and low driving voltages have been demonstrated in the LEDs fabricated from PFs. Unfortunately, the emission colors of PFs are normally not pure blue, but whitish or even greenish blue because of the formation of interchain excimers, and the problem of color impurity becomes more serious with the operation of the devices. Having this drawback, PFs are not suitable for the realization of full-color displays.

For completeness, the main related references are listed below.

1. A. W. Grice, A. Tajbakhsh, P. L. Bum, and D. D.C. Bradley, Adv. Mater. 9, 1174 (1997).

2. M. R. Andersson, M. Berggren, O. Inganas, G. Gustafsson, J. C. Gustafsson-Carlberg, D. Selse, T. Hjertberg, and O. Wennerstrom, Macromolecules 28, 7525 (1995).

3. B. S. Kang, M.-L. Seo, Y. S. Jun, C. K. Lee, and S. C. Shin, Chem. Commun., 1167 (1996).

4. W.-L. Yu, H. Meng, J. Pei, Y.-H. Lai, S.-J. Chua, and W. Huang, Chem. Commun., 1957 (1998).

5. F. Garten, A. Hilberer, F. Cacialli, E. Esselink, Y. van Dam, B. Schlatmann, R. H. Frienf, T. M. Klapwijk, and G. Hadziioannou, Adv. Mater. 9, 127 (1997).

6. C. Hosokawa, N. Kawasaki, S. Sakamoto, and T. Kusumoto, Appl. Phys. Lett. 61, 2503 (1992).

7. V. Cimnrova, D. Neher, M. Remmers, and I. Kminek, Adv. Mater. 10, 676 (1998).

8. G. Grem, G. Leditzky, B. Ullrich, and G. Leising, Adv. Mater. 4, 36 (1992).

9. Y. Yang, Q. Pei, and A. J. Heeger, J. Appl. Phys. 79, 934 (1996).

10. T. Vahlenkamp and G. Wegner, Macromol. Chem. Phys. 195, 1933 (1994).

11. M. Fukuda, K. Sawada, K. Yoshino, J. Polymer Sci.: Part A: Polymer Chemistry 31, 2465 (1993).

12. Y. Ohmori, M. Uchida, k. Muro, k. Yoshino, Jpn. J. Appl. Phys. 30, L1941 (1991).

13. Q. Pei and Y. Yang, J. Am. Chem. Soc. 118, 7416 (1996).

14. A. W. Grice, D. D.C. Bradley, M. T. Bernius, M. Indasekaran, W. W. Wu, and E. P. Woo, Appl. Phys. Lett. 73, 629 (1998).

15. S. Janietz, D. D.C. Bradley, M. Grell, C. Giebeler, M. Inbasekaran, and E. P. Woo, Appl. Phys. Lett. 73, 2453 (1998).

16. R. H. Friend, R. W. Gymer, A. B. Holmes, J. H. Burroughes, R. N. Marks, C. Taliani, D. D.C. Bradley, D. A. Dos Santos, J. L. Bredas, M. Logdlund, W. R. Salaneck, *Nature* 397, 121 (1999).

17. J.-I. Lee, G. Klaemer, R. D. Miller, Chem. Mater. 11, 1083 (1999).

Insofar as prior patent documents are concerned, an important patent related to the synthetic process of the polymers of the present invention (but which is not related to the polymers themselves) is U.S. Pat. No. 5,777,070.

Other patents related to the general field of the present invention are U.S. Pat. No. 5,708,130 and WO 97/05184 ("2,7-Aryl-9-substituted fluorenes and 9-substituted fluorene oligomers and polymers"), U.S. Pat. No. 5,900,327 and WO 97/33323 ("Polyfluorenes as materials for photoluminescence and electroluminescence"), U.S. Pat. No. 5,807,974 ("Fluorene based alternating copolymers for electroluminescence element and using such copolymers as light emitting materials"), and U.S. Pat. No. 5,876,864 ("Fluorene based alternating copolymers containing acetylene group and electroluminescence element").

DETAILED DESCRIPTION OF INVENTION

The polymers of the present invention, as depicted in FIG. 1, have a backbone structure of alternate 2,7-fluorene and 1,4-phenylene units, in which $R_1$, $R_2$, $R_3$ and $R_4$, which may be identical or different, are each selected from the group consisting of H, a ($C_1$–$C_{22}$) linear or branched alkyl, alkoxy or oligo (oxyethylene) group, a ($C_6$–$C_{30}$) cycloalkyl group, and an unsubstituted or substituted aryl group, and n is from about 3 to about 5000. The attachment of different functional groups on the 9-position of the fluorene ring and on the phenylene ring enables the solution-processability of the resulting polymers and the optical and electronic tunability of the polymers to be varied. Preferably, dialkyl chains are attached at the 9-position of the fluorene ring and dialkoxyl chains are attached at the 2- and 5-positions of phenylene ring. This results in blue light emission from the resulting polymers. The PL spectra of such compounds, one of which is shown by way of example in FIG. 2, correspond to a pure deep blue color without measurable longer wavelength components. The polymers may be synthesized, for example, by a Suzuki coupling reaction from corresponding monomers, e.g., 2,7-bis(trimethylene boronate)s of 9,9-dialkylfluorenes and 1,4-dibromo-2,5-dialoxybenzenes. The general synthetic route is presented in FIG. 5.

Figure 5:
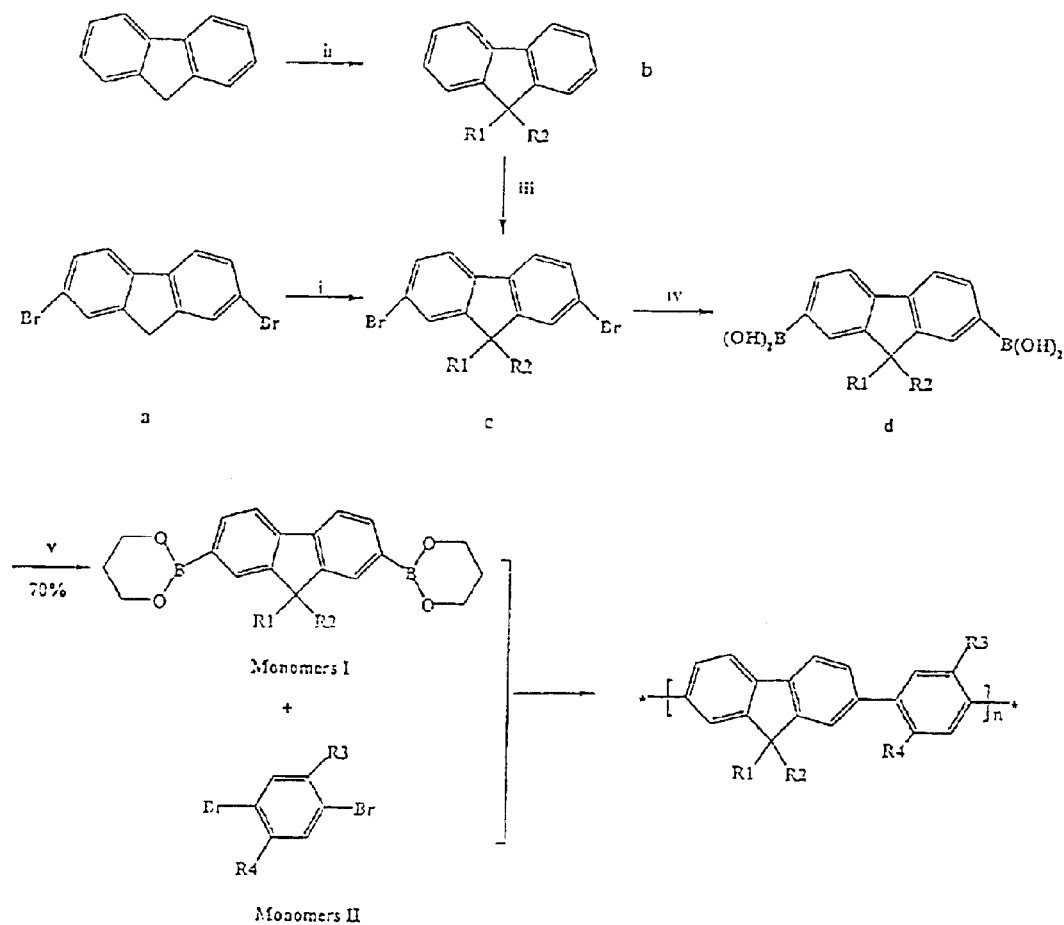

Referring to FIG. 5, Monomers I [9,9-dialkylfluorene-2,7-bis(trimeylene boronate)], can be synthesised from the starting material of 2,7-dibromofluorene (a). The reaction of 2,7-dibromofluorene with 1-bromoalkanes in 50% NaOH aqueous solution in the presence of tetrabutylammonium chloride at 80° C. afforded 2,7-dibromo-9,9-dialkylfluorenes (c) as white crystals after purification by recrystallisation from, for example, ethanol. Alternatively, 2,7-dibromo-9,9-dialkylfluorenes (c) can also be obtained starting from fluorene, by reacting fluorene with 2 equivalents of butyllithium at −78° C. in THF. The resulting 9,9-dilithiofluorene is then reacted with 1-bromoalkanes at −78 to 20° C. to produce 9,9-dialkylfluorenes (b). The 9,9-dialkylfluorenes may then be separated by, for example, vacuum distillation. Bromination of the 9,9-dialkylfluorenes with 2.1–2.2 equivalents of bromine in chloroform under the catalysis of ferric chloride affords the 2,7-dibromo-9,9-dialkylfluorenes (c). A 2,7-dibromo-9,9-dialkylfluorene (c) may be treated with magnesium (turnings) in THF to form a Grignard reagent. The Grignard reagent solution may then be dripped slowly into a stirred solution of trimethyl borate (3 equivalents) in THF at −78° C. The mixture is then stirred at −78° C. for 2 h and then at room temperature for two days. The reaction mixture is then poured into crushed ice containing sulphuric acid (5%) under stirring, and the mixture is extracted with ether and the combined extracts evaporated to give a white solid. Purification of the crude product by recrystallisation or/and by column chromatography affords a pure product of 9,9-dialkylfluorene-2,7-dibronic acid (d) as white solid. The dibronic acids (d) may then be reacted with 1,3-propanediol in toluene under reflux to produce the monomers I.

The monomers II [1,4-dibromo-2,5-dialoxylbenzenes], may be prepared from hydroquinone by reaction with 1-bromoalkanes in a solution of NaOEt in ethanol and a subsequent bromination with bromine. In the case where the substituents at the 2- and 5-positions of the benzene ring are alkyl groups, they may be synthesized from 1,4-dibromobenzene through a reaction with Grignard reagents of bromoalkanes in ether catalysed by dichloro[1,3-bis(diphenylphosphino)propane]nickel(II) ($NiCl_2$[dppp]) and a subsequent bromination with brine catalysed by ferric chloride or iodine.

It will be appreciated, of course, that the monomers, which themselves are non-limiting, could be produced by a variety of other synthetic routes known to those skilled in the art.

The polymerization may be performed in a mixed solvent system of an organic solvent and an aqueous solution of inorganic base. The organic solvents may be toluene and xylene. The inorganic bases may include alkali metal carbonates and bicarbonates. Preferably, the aqueous solution of inorganic base is 2 M potassium or sodium carbonate solution. Equal molar mixtures of Monomers I and Monomers II are dissolved are a degassed organic solvent. The total concentration of monomers is normally in the range of 0.25 to 0.50 M. A degassed inorganic base solution (conveniently 2 M) is then added under nitrogen. The volume ratio of organic solvent to inorganic base solution is preferably controlled to be 3:1 to 3:2. 0.5–1.5% Mole (based on the number of total moles of monomers) of tetrakis (triphenylphoshine)palladium(0) ($Pd(Ph_3P)_4$) dissolved in a small amount of organic solvent is added into the mixture under nitrogen. The reaction mixture is vigorously stirred at 90–100° C., for 24–36 h under the protection of nitrogen. A phase transition catalyst e.g., Aliquat 336 from Aldrich, may be added at the beginning or in the process of the polymerization to shorten the reaction time. At the end of the polymerization, a monofunctional aryl boronate, e.g., 4-methylbenzeneboronate, and a monofunctional aryl halide, e.g, 4-bromotoluene, may be added into the reaction mixture in proper order to cap the ends of the resulting polymers. The reaction mixture is added slowly to stirred methanol. The polymer is precipitated and collected by filtration, and is washed successively with methanol, deionized water, and methanol, for example. The polymer is then subjected to Soxhlet extraction with acetone for at least 24 h to remove the trace of catalyst and the low molecular components. Finally, the polymer is dried under vacuum at room temperature for at least 12 h. The polymers are normally off-white to pale yellow solids.

As with the discussion above in relation to the monomer preparation, it will be appreciated by those skilled in the art that the polymerization process could be effected in a variety of other ways, and the example given above is not therefore limiting in any way.

Figure 3:
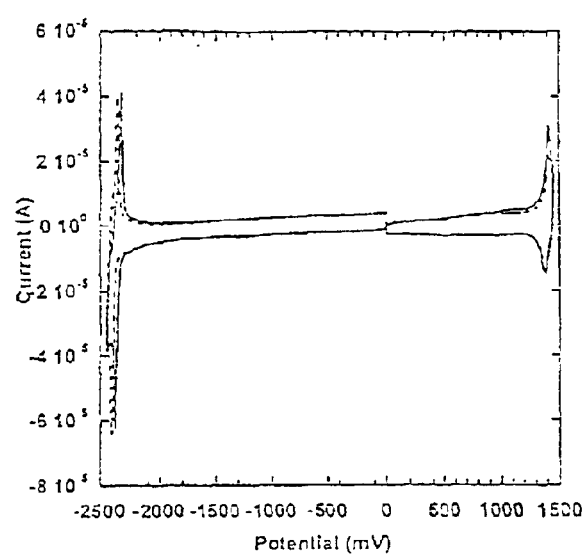

The polymers of the invention readily dissolve in common organic solvents, such as THF, chloroform, toluene, xylene, etc. Electrochemical investigation (cyclic voltammetry) reveals that both the oxidation and the reduction process of the polymers are highly reversible and the polymers have good electrochemical stability. The first scan and the tenth scan cyclic voltammograms of a polymer are shown in FIG. 3. Optical quality films of the polymers on different substrates, such as quartz plates, micro slides, ITO (indium tin oxide) coated glass, and metallic polymer coated ITO glass, can be prepared by conventional spin-coating technology from their solutions in toluene and xylene.

Another aspect of the invention relates to blue polymer light emitting diodes (PLEDs) comprising a film of the polymers described above. ITO or polyaniline (PANI) in the conductive emeraldine salt form, which have relatively high work functions and are (semi)transparent, can be used as the anode (or hole injecting electrode) materials in the LED devices. In single-layered devices, a film of the above described polymers may be deposited on such an anode. Typical film thicknesses of the polymer films range from 50 to 150 nm. Onto the surface of the polymer film, a metal layer may be typically thermally evaporated to serve as a cathode. The metal should preferably have a relatively low work function to facilitate the electron injection. Preferably, calcium is used.

In order to improve the hole injection from the anode into the polymer films, a hole injecting layer and a hole transporting layer may be used in this invention. Copper phthalocyanine (CuPc) may be used as the hole injecting material. A uniform layer of CuPc with a thickness ranging from 8 to 70 nm is formed on an ITO surface by thermal evaporation under a pressure below $10^{-6}$ Torr. The CuPc layer has very little absorption for blue light as demonstrated from its absorption spectrum. Onto the CuPc layer, a hole transporting layer is deposited. Polyvinylcarbazole (PVK) and polymeric arylamines may be used as the hole-transporting materials. A film of the polymers of the present invention is then deposited onto the hole transporting layer.

The LED devices fabricated from the polymers of the invention may emit pure deep blue light under an applied voltage. One representative electroluminescence (EL) spectrum is given in FIG. 4. The invention provides a new series of efficient blue electroluminescent polymers for fabrication of pure blue polymer light-emitting diodes, which are essential for the development of full-color displays based on polymeric materials.

The invention also solves the problem of color impurity existing in the current blue electroluminescent polymeric materials.

The present invention will now be explained in more detail with reference to the following Examples, which are included to further understanding of the present invention, but which are not intended to limit its scope in any way.

EXAMPLE 1

Synthesis of 2,7-Dibromo-9,9-dihexylfluorene from 2,7-Dibromofluorene 9.72 g (0.03 mole) of 2,7-dibromofluorene, 27.2 g (0.165 mole) of n-hexyl bromide, 2.5 g (0.009 mole) of tetra-n-butylammonium chloride, and 60 ml of 50% NaOH aqeous solution were charged into a 250 ml round bottomed flask. The mixture was degassed by nitrogen flow at room temperature for 0.5 h, and then the mixture was vigorously stirred at 80° C. under nitrogen for 12 h. The color of the reaction mixture changed from deep purple to orange and then finally to yellow. The reaction mixture was allowed to cool to room temperature. 100 ml of deinoized water was added and the mixture was extracted with ether. The combined ether solution was washed with water and brine and was dried over anhydrous $MgSO_4$. The solvent was removed and the residue was recrystallized twice from ethanol to give 12.9 g of colorless crystal (87.5% yield). MS (EI, m/e): 492/100% ($M^+$), 407/23.5%, 323/96.5%, 176/52.3%. $^1H$ NMR (200 MHz, $CDCl_3$): 7.53 (d, 2H), 7.46 (d, 2H), 7.44 (d, 2H), 1.91 (m, 4H), 1.25–0.95 (m, 16H), 0.78 (t, 6H) ppm.

EXAMPLE 2

Synthesis of 2,7-Dibromo-9,9-Dioctylfluorene from Fluorene

To a solution of 25.0 g of fluorene in 200 ml of THF at −78° C. was added dropwise 220 ml of 1.6 M butyllithium solution in hexane. The mixture was stirred at this temperature for 1 h and was then allowed to warm to 15° C. The temperature was cooled down to −78° C. again and 77.7 g of n-octyl bromide was added dropwise into the mixture. The solution was allowed to warm to room temperature and was stirred at room temperature for 12 h. The mixture was poured into water and was extracted with ether. The combined extracts were washed with water and brine and were dried over anhydrous magnesium sulphate. The solvent was removed by rotary evaporation. Distillation under reduced pressure gave 50 g of 9,9-dioctylfluorene as a pale yellow oil (212–214° C./2 Toor) (yield 85.2%).

50 g (0.128 mole) of the 9,9-dioctylfluorene was dissolved in 200 ml of chloroform and then 0.32 g of anhydrous ferric chloride was added. To the solution, 43.0 g (0.269 mole) of bromine was added dropwise at 0° C. After the addition, the solution was warmed to room temperature and was stirred overnight. During the reaction, the reaction system was excluded from light. At the end of the reaction, the reaction mixture was poured into 300 ml of saturated sodium thiosulphate aqueous solution. The mixture was stirred at room temperature until the red color disappeared. 300 ml of water was added and the mixture was extracted with chloroform. The combined extracts were washed with water and brine and dried over anhydrous magnesium sulphate. The solvent was removed and the residue was recrystallized twice from ethanol to afford 61.5 g of colorless crystal (yield 87.5%). $^1H$ NMR (200 MHz, $CDCl_3$): 7.53 (d, 2H), 7.47 (d, 2H), 7.44 (d, 2H), 1.91 (m, 4H), 1.35–0.93 (m, 24 H), 0.83 (t, 6H) ppm.

EXAMPLE 3

Synthesis of 9,9-Dihexylfluorene-2,7-Bis (Trimethylene Boronate)

14.76 g (0.03 mole) of 2,7-dibromo-9,9-dihexylfluorene reacted with 1.58 g (0.066 mole) of magnesium turnings in 80 ml of dried THF (ignited by iodine) to generate the Grignard reagent. The Grignard reagent solution was added dropwise into a solution of 12.44 g (0.12 mole) of trimethyl borate in 200 ml of dried THF over a period of 2 h. The mixture was allowed to warm to room temperature and stirred for 36 h. The reaction mixture was poured into 1 Kg of crushed ice containing 30 ml of concentrated sulphate acid and the mixture was stirred at room temperature for 12 h. The aqueous solution was extracted repeatedly with ether (200 ml×4). The combined extracts were washed with water and brine. Most of the solvent was removed by rotary evaporation. Before the solid appeared, 50 ml of hexane was added to precipitate the solid. The solid was washed with hexane and was recrystallized from acetone to produce 9.5 g of 9,9-dihexylfluorene-2,7-diboronic acid in white solid (yield 74.7%).

9.0 g (0.021 mole) of the 9,9-dihexylfluorene-2,7-diboronic acid and 4.85 g (0.064 mole) of trimethylene glycol were dispersed in 250 ml of toluene. The mixture was refluxed for 8 h. The resulting solution was washed with water and brine and was dried over anhydrous magnesium sulphate. The solvent was removed to afford a yellow solid. The crude product was purified by column chromatography (silica gel, 5:1 hexane/ethyl acetate mixture) and then was recrystallized from hexane to give 7.5 g of white crystal (yield 70.4%). 1H NMR (200 MHz, $CDCl_3$): 7.76 (d, 2H), 7.72 (s, 2H), 7.69 (d, 2H), 4.21 (t, 8H), 2.10 (m, 4H), 1.98 (m, 4H), 1.22–0.90 (m, 16 H), 0.74 (t, 6H).

EXAMPLE 4

Synthesis of Poly[(9,9-Dihexyl-2,7-Fluorene)-Alt-Co-(2,5-dioctoxyl-1,4-phenylene)] (PDHFDDOP)

0.753 g (1.5 mmole) of 9,9-dihexylfluorene-2,7-bis(trimethylene boronate) and 0.822 g (1.5 mmole) of 1,4-dibromo-2,5-dioctoxylbenzene were dissolved in 4 ml of degassed toluene under nitrogen. 4 ml of degassed 2 M $K_2CO_3$ aqueous solution and 0.017 g of tetrakis (triphenylphosphine)palladium(0) dissolved in 2 ml of degassed toluene were added into the solution. The mixture was vigorously stirred under nitrogen at 90–100° C. for 48 h. The reaction mixture was added slowly into a stirred solution of 150 ml of methanol and 15 ml of deionized water. The fibrous polymer was precipitated out and collected by filtration. The polymer was washed successively with methanol, water, and then methanol. After drying under vacuum at room temperature, the polymer is yellow to gray in color. The crude polymer was re-dissolved in 20 ml of THF, and the THF solution was vigorously stirred together with 30 ml of 50% aqueous hydrazine at room temperature for 24 h. The THF layer was separated and was slowly added into a stirred solution of 150 ml of methanol and 15 ml of deionized water. The fibrous polymer was collected by filtration and was washed with water and methanol. The polymer was then washed with acetone on a Soxhlet extractor for 24 h and dried in a vacuum at room temperature. The final polymer weighed 0.91 g (84% yield). $^1$H NMR (200 MHz, $CDCl_3$): 7.81 (d, 2H), 7.74 (s, 2H), 7.58 (d, 2H), 7.14 (s, 2H), 3.99 (t, 4H), 2.05 (b, 4H), 1.72 (t, 4H), 1.50–0.97 (m, 44H), 0.95–0.70 (m, 12H) ppm. Anal. Calcd. for $C_{51}H_{76}O_2$: C, 84.94; H, 10.62. Found: C, 84.50; H, 10.59. A thin film on a quartz plate spin-cast from a solution of toluene has a UV-V is absorption peak at 368 nm, photoluminescent emission peaks at 420 and 448 nm, and absolute photoluminescence quantum efficiency of about 40%.

Figure 2:
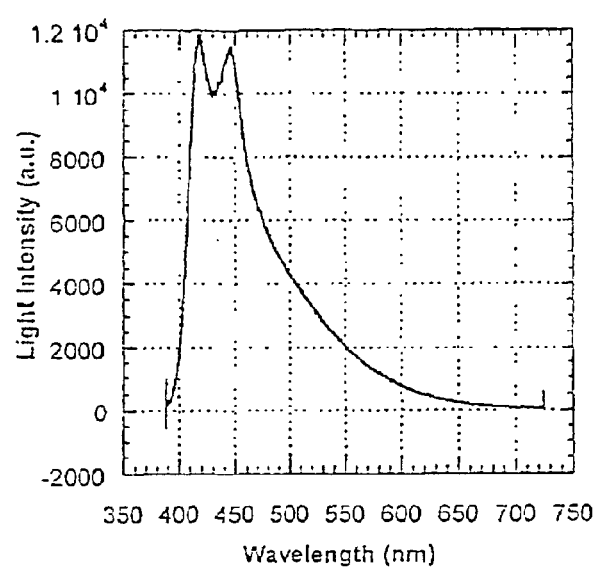
Figure 4:
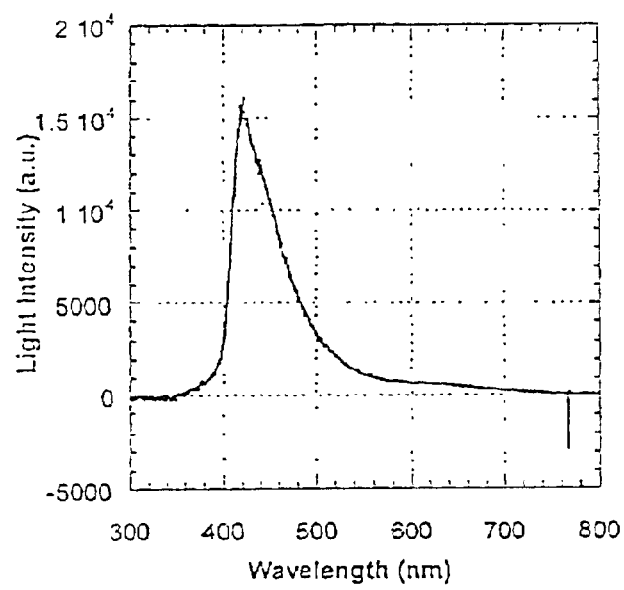

FIG. 2 shows the photoluminescene spectrum of the compound made in accordance with Example 4, FIG. 3 shows a first scan and tenth scan cyclic voltammogram of the compound, and FIG. 4 shows its electroluminescene spectrum.

EXAMPLE 5

Synthesis of Poly[(9,9-Dihexyl-2,7-Fluorene)-Alt-Co-(2,5-dihexyl-1,4-phenylene)] (PDHFDHP)

The procedure of Example 4 was repeated with 0.628 g (1.25 mmole) of 9,9-dihexylfluorene-2,7-bis(trimethylene boronate) and 0.505 g (1.25 mmole) of 1,4-dibromo-2,5-dihexylbenzene in a mixture of toluene (6 ml) and 2M $K_2CO_3$ aqueous solution containing 0.014 g of tetrakis (triphenylphosphine)palladium(0). 0.4 g of purified polymer was obtained in white solid (yield 56%). $^1$H NMR (200 MHz, $CDCl_3$): 7.82 (d, 2H), 7.47–7.34 (b, 4H), 7.28 (s, 2H), 2.69 (b, 4H), 2.02 (b, 4H), 1.70–1.00 (m, 32H), 0.98–0.70 (m, 12H) ppm. Anal. Calcd. for $C_{43}H_{60}$: C, 89.52; H, 10.48. Found: C, 87.50; H, 10.31. A thin film on a quartz plate spin-cast from a solution of toluene has an UV-Vis absorption peak at 322 nm, and a photoluminescent emission peak at 408 nm.

EXAMPLE 6

Light emitting diodes were fabricated with PDHFDDOP using ITO as the anode and calcium as the cathode; i.e. ITO/PDHFDDOP/Ca. The PDHFDDOP film was spin-cast from a toluene solution (3%, w/v). The thickness of the film is about 75 nm. A Calcium electrode (150–200 nm) was thermally evaporated onto the polymer film at <$10^{-6}$ Torr. The active area was 0.15 $cm^2$ as defined by the calcium electrode. Pure blue light emission was observed above a forward bias (ITO wired positive) of 10–12 V. The maximum external EL quantum efficiency was measured to be around 0.3% (photon/electron).

EXAMPLE 7

A device was fabricated with a PVK hole transporting layer between the anode (ITO) and PDHFDDOP layer; i.e. in the configuration of ITO/PVK/PDHFDDOP/Ca. The device turned on at ~10 V and reached a brightness of 115 $cd/m^2$ at 35 $mA/cm^2$ for a bias of 23–24 V. The EL external quantum efficiency was greater than 0.5%. The EL emissive spectrum was measured as shown in FIG. 4. The EL spectrum peaks at 420 nm without longer wavelength components and corresponds to a pure deep blue color.

EXAMPLE 8

A device was fabricated using conductive polyaniline (in emeraldine salt form) (PANI)-coated ITO glass as anode and with a PVK hole transporting layer between PANI and PDHFDDOP; i.e. in the configuration of ITO/PANI/PVK/PDHFDDOP/Ca. The device turned on at ~16 V and reached a brightness of 230 $cd/m^2$ at a bias voltage of 28.5 V. The external EL quantum efficiencies were 0.4–0.5%. The EL emissive spectrum was similar to that obtained in Example 7.

EXAMPLE 9

A device was fabricated with a copper phthalocyanine (CuPc) between the ITO anode and PDHFDDOP layer; i.e. in the configuration of ITO/CuPc/PDHFDDOP/Ca. The device turned on at 4–5 V and exhibited an external EL quantum efficiency of 0.11–0.15%.

EXAMPLE 10

A device with the configuration of ITO/CuPc/PVKPDHFDDOP/Ca was fabricated. The device turned on at 7 V and reached a brightness of ~1000 $cd/m^2$ at a bias voltage of 22.5 V (~530 $mA/cm^2$). The maximum external EL quantum efficiency was measured to be ~0.3%.

We claim:

1. A polymeric material comprising alternate substituted fluorene and phenylene units, as represented by the following formula

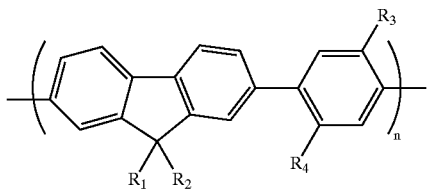

wherein $R_1$ and $R_2$ which may be identical or different, are each H, a ($C_1$–$C_{22}$) linear or branched alkyl, alkoxy or oligo (oxyethylene) group, a ($C_6$–$C_{30}$) cycloalkyl group, or an unsubstituted or substituted aryl group; wherein $R_3$ and $R_4$, which may be identical or different, are each a linear or branched octoxyl group; and wherein n is from about 3 to about 5000.

2. The polymeric material according to claim 1 wherein n is from about 5 to about 1000.

3. A The polymeric material according to claim 1 which emits visible light having a wavelength of between 350 and 550 nm.

4. The polymeric material according to claim 3 which emits visible light having a wavelength of about 430 nm.

5. A light emitting diode comprising a polymeric material in accordance with claim 1.

6. The light emitting diode according to claim 5 having an anode layer, a polymer layer comprising a polymeric material in accordance with claim 1, and a metal cathode layer.

7. The light emitting diode according to claim 5 having an additional hole transporting layer between the anode layer and the polymer layer.

8. The light emitting diode according to claim 7 wherein the transporting layer includes polyvinylcarbazole.

9. The light emitting diode according to claim 7 having an additional hole injection layer between the hole transporting layer and the polymer layer.

10. The light emitting diode according to claim 9 wherein the hole injection layer comprises copper phthalocyanine.

11. The light emitting diode according to claim 9 wherein the hole injection layer comprises polyaniline.

12. A full color display incorporating a polymeric material in accordance with claim 1.

13. The full color display incorporating a light emitting diode in accordance with claim 5.

14. The polymeric material according to claim 1 made in accordance with a Suzuki coupling process.

15. The polymeric material according to claim 14 wherein the monomers are 2,7-diboronates of 9,9-disubstituted fluorenes and 1,4-dibromo-2,5-dioctoxylbenzene.

16. The polymeric material according to claim 14 wherein the monomers are prepared using Grignard reagents.

17. A polymeric material comprising Poly[(9,9-dihexyl-2,7-fluorene)-alt-co-(2,5-dioctoxyl-1,4-phenylene)].

18. The polymeric material according to claim 17 comprising alternatesubstituted fluorene and phenylene units, as represented by the following formula 9,9-dihexyl-2,7-fluorene)-alt-co-(2,5-dioctoxyl-1,4-phenylene$_n$-;

wherein n is from about 3 to about 5000.

* * * * *

UNITED STATES PATENT AND TRADEMARK OFFICE
CERTIFICATE OF CORRECTION

PATENT NO. : 6,887,972 B2
DATED : May 3, 2005
INVENTOR(S) : Wei Huang et al.

It is certified that error appears in the above-identified patent and that said Letters Patent is hereby corrected as shown below:

Title page,
Item [73], Assignee, change "Agency for Science, Technology and Research, Centros (SG)" to -- Agency for Science, Technology and Research, Singapore (SG) --.

Signed and Sealed this

Thirtieth Day of August, 2005

JON W. DUDAS
*Director of the United States Patent and Trademark Office*